United States Patent
Nelson et al.

(10) Patent No.: US 8,031,470 B2
(45) Date of Patent: Oct. 4, 2011

(54) SYSTEMS AND METHODS FOR THERMAL MANAGEMENT

(75) Inventors: Michael J. Nelson, Prior Lake, MN (US); Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 83 days.

(21) Appl. No.: 12/472,490

(22) Filed: May 27, 2009

(65) Prior Publication Data

US 2009/0310309 A1    Dec. 17, 2009

Related U.S. Application Data

(60) Provisional application No. 61/060,593, filed on Jun. 11, 2008.

(51) Int. Cl.
*H05K 7/20* (2006.01)
(52) U.S. Cl. ........ 361/704; 361/690; 361/703; 361/707; 361/709; 361/716; 165/185; 174/547; 174/548
(58) Field of Classification Search ............ 361/690, 361/700, 702–704, 707, 709–710, 715–716; 165/80.2–80.5, 104.33, 185; 174/15.2, 16.3, 174/50, 50.5–50.51, 50.54, 520, 526, 547–548
See application file for complete search history.

(56) References Cited

U.S. PATENT DOCUMENTS

| | | | |
|---|---|---|---|
| 5,157,577 A | 10/1992 | Balaud | |
| 5,461,542 A * | 10/1995 | Kosak et al. | 361/710 |
| 5,710,804 A | 1/1998 | Bhame et al. | |
| 5,894,407 A | 4/1999 | Aakula et al. | |
| 5,905,244 A | 5/1999 | Smith | |
| 5,930,116 A * | 7/1999 | Palmer | 361/704 |
| 5,946,193 A | 8/1999 | Hendrix et al. | |
| 6,038,129 A * | 3/2000 | Falaki et al. | 361/699 |
| 6,082,441 A | 7/2000 | Boehmer et al. | |
| 6,142,595 A | 11/2000 | Dellapi et al. | |

(Continued)

FOREIGN PATENT DOCUMENTS

DE    19515122 A1 * 10/1996

OTHER PUBLICATIONS

Translation of Wolf, German patent DE 195 15 122 A1, published on Oct. 31, 1996, translated on Feb. 1, 2011.*

*Primary Examiner* — Robert J Hoffberg
(74) *Attorney, Agent, or Firm* — Fogg & Powers LLC

(57) ABSTRACT

A method for thermal management is provided. The method includes providing thermal isolation between at least one high-power thermally tolerant electronic component and at least one low-power thermally sensitive electronic component housed within an electrical enclosure, providing a first conductive path from the at least one low-power electronic component to a first heatsink, providing a second conductive path from the at least one high-power electronic component to a second heatsink, dissipating heat generated by the at least one low-power thermally sensitive electronic component and dissipating heat generated by the at least one high-power thermally tolerant electronic component to an environment external to the electrical enclosure by channeling the heat generated by the at least one low-power thermally sensitive electronic component and the at least one high-power thermally tolerant electronic component along the first and second conductive path, respectively. The first and second conductive paths are independent from each other.

22 Claims, 9 Drawing Sheets

U.S. PATENT DOCUMENTS

| | | |
|---|---|---|
| 6,229,707 B1 | 5/2001 | Keenan |
| 6,310,772 B1 | 10/2001 | Hutchinson et al. |
| 6,452,810 B1 | 9/2002 | Wilcox |
| 6,512,669 B1 | 1/2003 | Goodwin |
| 6,556,443 B1 | 4/2003 | Wei |
| 6,579,029 B1 | 6/2003 | Sevde et al. |
| 6,621,712 B2 | 9/2003 | Siira |
| 6,788,535 B2 | 9/2004 | Dodgen et al. |
| 6,995,978 B2 | 2/2006 | Strauss |
| 7,027,300 B2 | 4/2006 | Lord |
| 7,116,555 B2 * | 10/2006 | Kamath et al. ............... 361/696 |
| 7,130,193 B2 * | 10/2006 | Hirafuji et al. ............... 361/700 |
| 7,177,154 B2 * | 2/2007 | Lee ............... 361/704 |
| 7,245,485 B1 | 7/2007 | Morrell |
| 7,277,286 B2 * | 10/2007 | Lee ............... 361/700 |
| 7,355,848 B1 | 4/2008 | Hodge et al. |
| 7,450,382 B1 | 11/2008 | Fischer et al. |
| 7,457,123 B1 | 11/2008 | Wayman |
| 7,495,169 B2 | 2/2009 | Adducci |
| 7,652,880 B2 * | 1/2010 | Wayman ............... 361/690 |
| 7,719,856 B2 * | 5/2010 | Nelson et al. ............... 361/807 |
| 7,724,521 B2 * | 5/2010 | Nelson et al. ............... 361/695 |
| 7,864,534 B2 * | 1/2011 | Wayman et al. ............... 361/716 |
| 2003/0016515 A1 | 1/2003 | Jackson |
| 2003/0031002 A1 | 2/2003 | Siira |
| 2003/0193774 A1 | 10/2003 | Shyr |
| 2004/0222517 A1 | 11/2004 | Robertson |
| 2005/0168941 A1 * | 8/2005 | Sokol et al. ............... 361/688 |
| 2006/0158866 A1 | 7/2006 | Peterson |
| 2006/0196640 A1 * | 9/2006 | Siu ............... 165/104.26 |
| 2006/0246276 A1 | 11/2006 | Chung |
| 2007/0025068 A1 | 2/2007 | Chen |
| 2007/0247809 A1 | 10/2007 | McClure |
| 2008/0043425 A1 * | 2/2008 | Hebert et al. ............... 361/687 |
| 2008/0237420 A1 | 10/2008 | Wayman et al. |
| 2008/0238270 A1 | 10/2008 | Wayman et al. |
| 2008/0239632 A1 | 10/2008 | Wayman |
| 2008/0239669 A1 * | 10/2008 | Wayman ............... 361/697 |
| 2008/0239673 A1 | 10/2008 | Wayman |
| 2008/0239688 A1 | 10/2008 | Casey et al. |
| 2008/0278912 A1 | 11/2008 | Zavadsky et al. |
| 2009/0231815 A1 * | 9/2009 | Kim et al. ............... 361/714 |
| 2009/0309467 A1 * | 12/2009 | Nelson et al. ............... 312/223.1 |
| 2009/0310972 A1 * | 12/2009 | Wayman et al. ............... 398/115 |
| 2009/0311969 A1 * | 12/2009 | Wayman et al. ............... 455/73 |
| 2009/0311974 A1 * | 12/2009 | Nelson et al. ............... 455/90.2 |

* cited by examiner

SYSTEMS AND METHODS FOR THERMAL MANAGEMENT

This application claims the benefit of U.S. Provisional Application No. 61/060,593, filed on Jun. 11, 2008, which is incorporated herein by reference in its entirety.

CROSS REFERENCE TO RELATED APPLICATIONS

This application is related to the following commonly assigned co-pending U.S. Patent Applications, filed on even date with U.S. Provisional Application 61/060,593, all of which are hereby incorporated herein by reference:

U.S. patent application Ser. No. 12/137,322, published as US-2009-0311969-A1 titled "COMMUNICATION MODULES" and which is referred to here as the '322 Application;

U.S. patent application Ser. No. 12/137,297, issued as U.S. Pat. No. 7,864,534 titled "APPARATUS FOR MOUNTING A MODULE AND ENABLING HEAT CONDUCTION FROM THE MODULE TO THE MOUNTING SURFACE" and which is referred to here as the '297 Application;

U.S. patent application Ser. No. 12/470,648, published as US-2009-0311974 A1 titled "SUSPENSION METHOD FOR COMPLIANT THERMAL CONTACT OF ELECTRONIC MODULES" and which is referred to here as the '589 Application;

U.S. patent application Ser. No. 12/137,307, published as US-2009-0309467-A1 titled "ANGLED DOORS WITH CONTINUOUS SEAL" and which is referred to here as the '307 Application;

U.S. patent application Ser. No. 12/137,309, issued as U.S. Pat. No. 7,724,521 titled "SYSTEMS AND METHODS FOR VENTURI FAN-ASSISTED COOLING" and which is referred to here as the '309 Application;

U.S. patent application Ser. No. 12/356,295, issued as U.S. Pat. No. 7,719,856 titled "CAM SHAPED HINGES" and which is referred to here as the '581 Application; and U.S. patent application Ser. No. 12/427,030, published as US-2009-0310972 A1 titled "SERF BOARD COMPONENTS" and which is referred to here as the '762 Application (renamed CIRCUIT CARD SUBASSEMBLIES FOR INTERCONNECTION OF ELECTRONIC COMPONENTS).

BACKGROUND

In the field of telecommunications, there is a trend to reduce both the size and the expenses associated with infrastructure equipment. The result is a demand on telecommunications infrastructure equipment providers to manufacture smaller equipment that can be operated and maintained in a more cost effective manner, while retaining all the functionality of legacy equipment. The modularity of designs proposed for such equipment, along with the smaller sizes desired by system operators, has introduced new thermal management challenges for dissipating heat generated by telecommunications infrastructure equipment. For example, telecommunications equipment typically includes high-power components, such as power amplifiers and power supplies that generate a significant amount of heat. The same equipment will typically also include relatively lower power components, such as integrated circuits, digital circuits, and the like, that generate relatively less heat than the high-power components, but are also significantly more sensitive to heat. As the enclosures housing these components are reduced in size to address customer demands, one challenge faced is how to design a single enclosure that can house and provide adequate cooling for both high-power components and heat-sensitive low-power components while preventing the high-power components from overheating the low-power components.

For the reasons stated above and for other reasons stated below which will become apparent to those skilled in the art upon reading and understanding the specification, there is a need in the art for improved systems and methods for thermal management of telecommunications infrastructure equipment.

SUMMARY

The present application relates to a method for thermal management. The method for thermal management includes providing thermal isolation between at least one high-power thermally tolerant electronic component and at least one low-power thermally sensitive electronic component housed within an electrical enclosure, providing a first conductive path from the at least one low-power thermally sensitive electronic component to a first heatsink, providing a second conductive path from the at least one high-power thermally tolerant electronic component to a second heatsink. The first conductive path is independent from the second conductive path. The first heatsink is thermally independent from the second heatsink. The method also includes dissipating heat generated by the at least one low-power thermally sensitive electronic component to an environment external to the electrical enclosure by channeling the heat generated by the at least one low-power thermally sensitive electronic component along the first conductive path to the first heatsink, and dissipating heat generated by the at least one high-power thermally tolerant electronic component to the environment external to the electrical enclosure by channeling the heat generated by the at least one high-power thermally tolerant electronic component along the second conductive path to the second heatsink.

The present application also relates to a sealable enclosure for housing at least one electrical components module including one or more high-power electronic components and one or more low-power thermally sensitive electronic components. The enclosure includes a first heatsink for dissipating heat from one or more low-power thermally sensitive electronic components to an external environment, and a second heatsink for dissipating heat from the one or more high-power electronic components to the external environment. The first heatsink and the second heatsink are thermally decoupled from each other. The one or more high-power electronic components are thermally decoupled from the one or more low-power thermally sensitive electronic components.

The present application also relates to heat removal system for a sealed electrical enclosure. The heat removal system includes a first conductive path from at least one low-power thermally sensitive electronic component to a first heatsink and a second conductive path from at least one high-power thermally tolerant electronic component to a second heatsink. The first conductive path is operable to dissipate heat generated by the low-power thermally sensitive electronic component to an environment external to the sealed electrical enclosure. The second conductive path is operable to dissipate heat generated by the at least one high-power thermally tolerant electronic component to the environment external to the sealed electrical enclosure. The first conductive path is independent from the second conductive path. The first heatsink is thermally independent from the second heatsink.

BRIEF DESCRIPTION OF THE DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize features relevant to the present invention. Like reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

This disclosure describes systems and methods for thermal management of electrical equipment, such as but not limited to, telecommunications equipment housed inside an enclosure. In one embodiment of the present invention, high-power (i.e., hot, high-heat generating, and thermally robust) electronics are attached to a large robust heatsink while relatively low-power (i.e., relatively cool, low-heat generating, and thermally sensitive) electronics conduct their heat to a smaller heatsink. The heatsinks in the embodiment discussed below form an enclosure but are relatively decoupled from each other with a long, relatively thin conduction path. The framework supporting the electronics is also de-coupled such that there is not a good conductive path between high-power and low-power electronics. That is, they are thermally isolated or thermally independent. As defined herein a "conductive path" is a "thermally conductive path" to conduct heat from a higher-heat area to a lower-heat area. Further, to remove heat from within an enclosure, embodiments of the present invention conductively channel the thermal energy generated from specific components to specific heatsinks rather than employing a common heatsink for removing thermal energy from the enclosure without regard to what component generated the thermal energy.

Figure 1A:
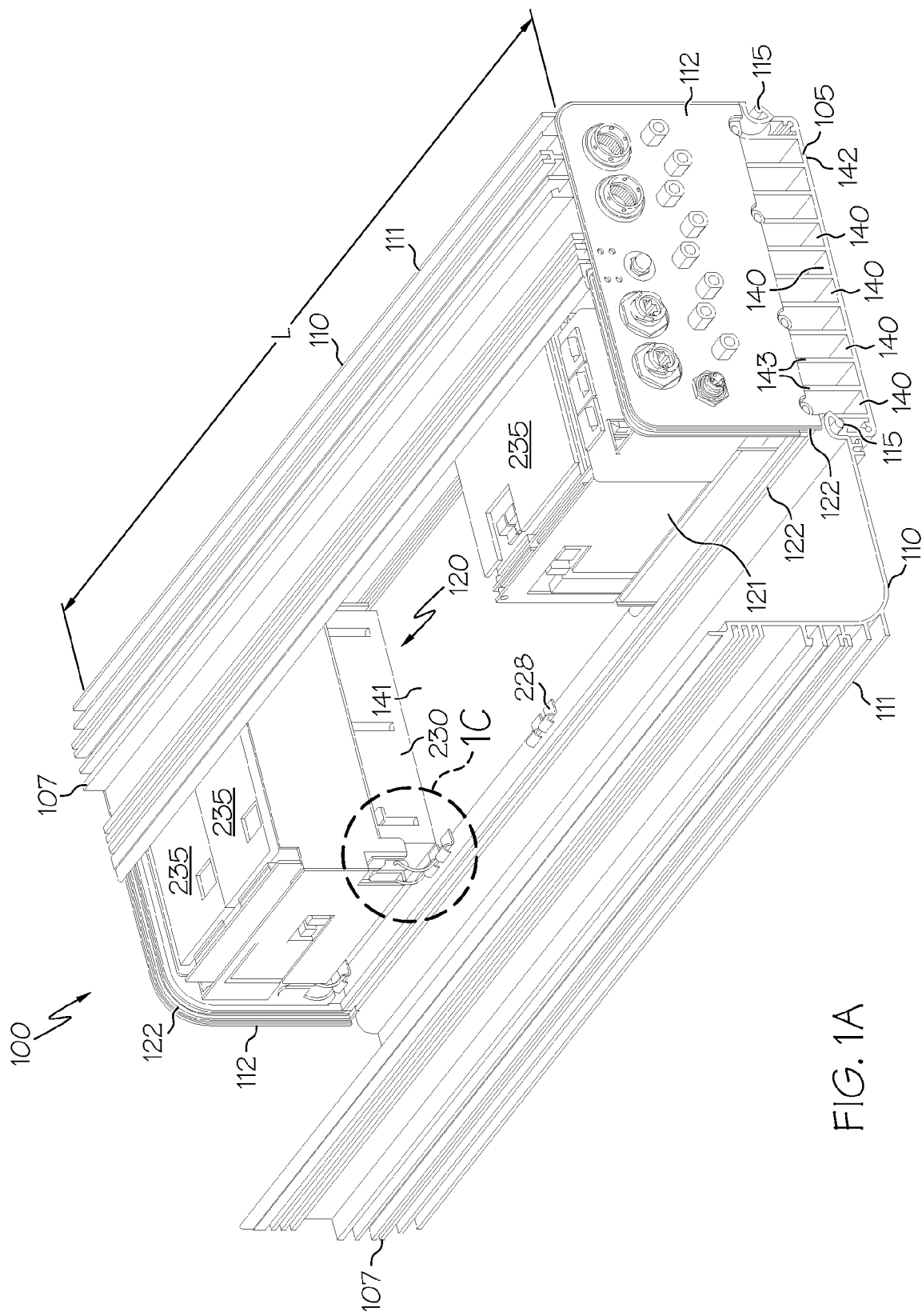
FIGS. 1A and 1B illustrate an enclosure of one embodiment of the present invention.
Figure 1B:
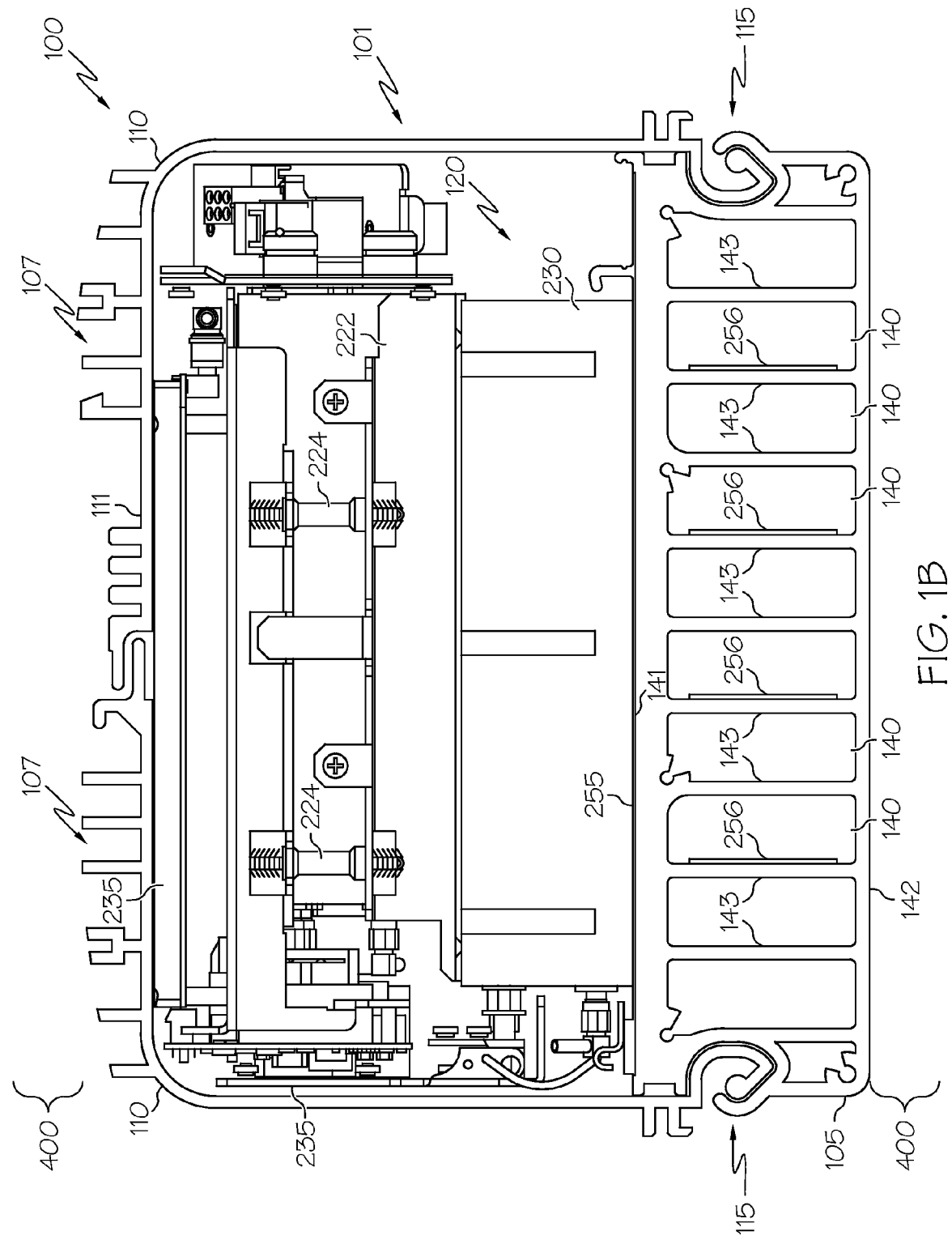

FIGS. 1A and 1B are diagrams illustrating an enclosure 100 of one embodiment of the present invention. Enclosure 100 (also referred to herein as "electrical enclosure 100" and "sealable enclosure 100") comprises a structural backplane 105, two doors 110 that each pivot around respective hinges 115 and two endplates 112 attached respectively to the ends of structural backplane 105 so that when doors 110 are closed, a sealed environment is created within enclosure 100. Thus, as defined herein, a sealed enclosure 100 is the enclosure 100 in which both of the doors 110 are in the closed position.

As defined herein, a structural backplane is a back surface (backplane) of an enclosure that includes structures for dissipating heat. In one implementation of this embodiment, the sealed enclosure 100 provides a weatherproof environment. In another implementation of this embodiment, sealed enclosure 100 provides an environment into which and out of which electro-magnetic radiation is not able to penetrate.

Enclosure 100 is shown in FIG. 1A with one door 110 in the open position to reveal electrical components modules 120 and 121 housed within enclosure 100 and to reveal space for one or more additional electrical components modules 120 and 121 to be housed within the enclosure 100. The enclosure 100 and the enclosed electrical components modules 120 and 121 housed within the sealed enclosure 100 form a heat removal system 101 (FIG. 1B). When the doors 110 pivot around respective hinges 115 to close the electrical components modules 120 and 121 within the enclosure 100, the electrical components modules 120 and 121 are operably positioned so that the low-power thermally sensitive electronic components 235 contact the doors 110 that function as a low-power heatsink.

As shown in FIGS. 1A-1B, structural backplane 105 includes a base 141 that forms an internal back surface of the enclosure 100 and an integral shield 142 that forms an external surface of the enclosure 100. The structural backplane 105 also includes a plurality of convective openings 140 (i.e., holes or open voids) that are each formed by two neighboring internal fins 143, the base 141, and the integral shield 142. The internal fins 143 are orthogonally arranged on the base 141. The internal fins 143 are enclosed by the base 141 and the integral shield 142 to form convective openings 140 that extend the length L of the structural backplane 105. Convective openings 140 promote a natural convective heat transfer between structural backplane 105 and the air of the environment surrounding enclosure 100, some of which will naturally flow through convective openings 140. The structural backplane 105 functions to remove heat from high-heat generating, high-power electronic components 230 (also referred to herein as "high-power thermally tolerant electronic components 230." Thus, the structural backplane 105 is also referred to herein as "backplane heatsink 105" or "high-power heatsink 105."

FIG. 1B also shows various embodiments of thermal-conduction-enhancement layers 255 and 256. The thermal-conduction-enhancement layer 255 includes a phase change material or a vapor chamber as described in detail below. The thermal-conduction-enhancement layer 256 includes a vapor chamber. In one implementation of this embodiment, the thermal-conduction-enhancement layer 256 is an internal fin 143 that is formed from the vapor chamber 256.

Also as shown in FIGS. 1A-1B, doors 110 each further include a series of fins 107 for promoting the convective transfer of heat absorbed by the doors 110 to the external environment 400 (FIG. 1B) surrounding enclosure 100. The phrases "external environment 400" and "environment 400" are used interchangeably herein. The doors 110 function to remove heat from low-heat generating, low-power electronic components 235 and 210 (also referred to herein as "low-power thermally sensitive electronic components 235 and 210," "low-power components 235 and 210," or "low-power electronics 235 and 210). The doors 110 are referred to herein as "a first heatsink 111."

In the particular embodiment shown in FIGS. 1A and 1B, electrical components module 120 includes, but is not limited to, the radiofrequency (RF) transceiver modules discussed in the '322 Application and '297 Application, both of which are herein incorporated by reference. In the particular embodiment shown in FIG. 1A, electrical components module 121 includes, but is not limited to, serialized radio frequency transceiver module discussed in the '762 Application, which is herein incorporated by reference.

In the particular embodiment of the enclosure 100 shown in FIGS. 1A and 1B is the enclosure described in the '307 Application, which is herein incorporated by reference, wherein doors 110 are the described "L-shaped" doors which are sealed against structural backplane 105 by a continuous seal 122 (FIG. 1A). Also, in the particular embodiment shown in FIGS. 1A and 1B, hinges 115 are the tapered hinges as described in the '581 Application, which is herein incorporated by reference.

Figure 1C:
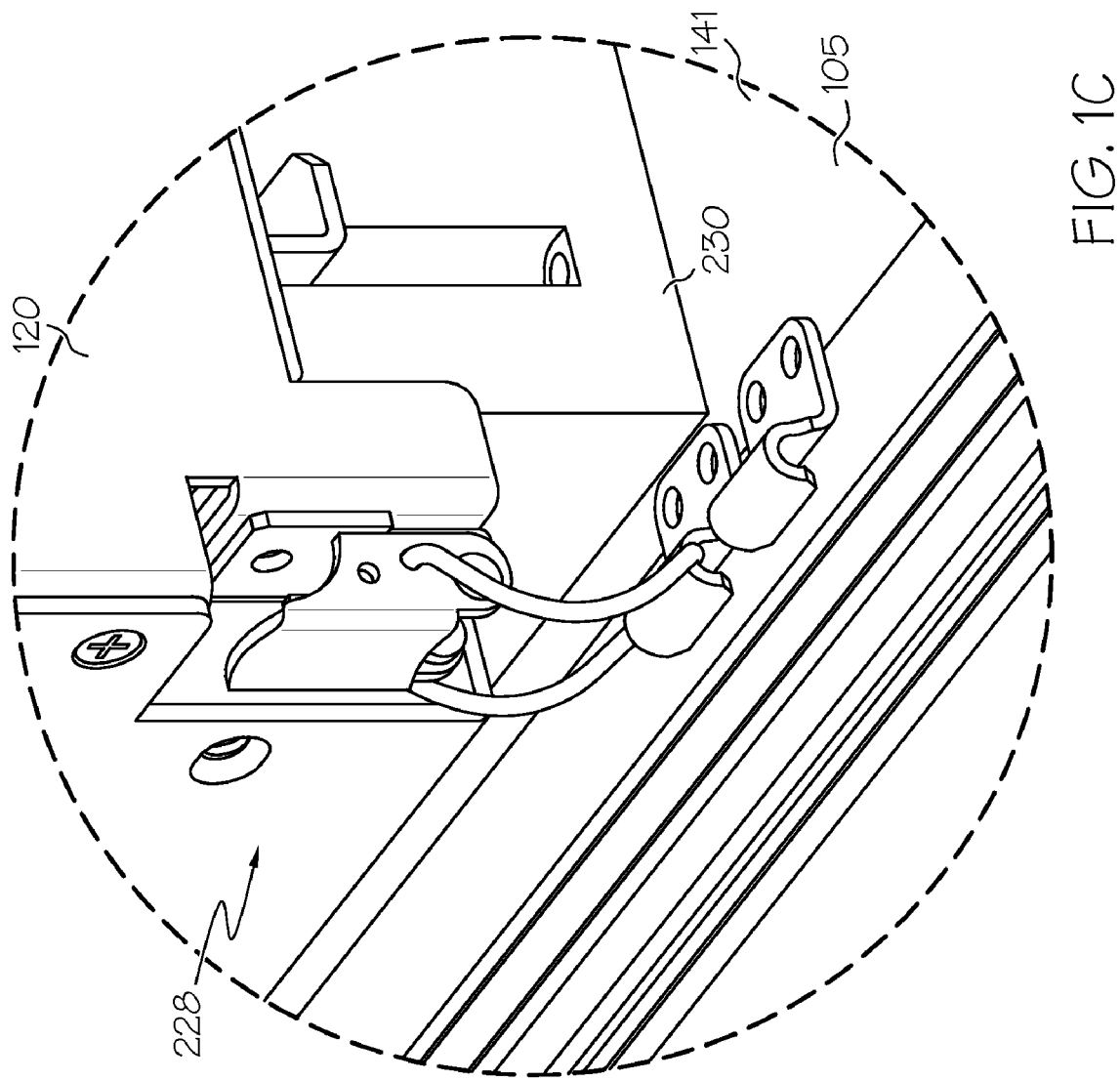
FIG. 1C illustrates a latching device of one embodiment of the present invention.

FIG. 1C illustrates a latching device 228 of one embodiment of the present invention. One or more latching devices 228 are used for securing the electrical components modules 120 in thermal contact with the structural backplane 105. Additional details related to latching devices 228 and securing electrical components module 220 to structural backplane 105 are provided in the '297 Application, which is herein incorporated by reference.

Low-power electronics typically require only a small heatsink in order to dissipate the thermal energy they produce. Such devices are also typically sensitive to heat and will fail if exposed to high heat conditions. It is not desirable to cool such heat sensitive electronics on a common heatsink also used to cool high-power electronics. For example, when a common heatsink absorbs heat from high-power electronics, it may warm to the point that it no longer has sufficient thermal capacity to absorb heat from the low-power electronics. This would deny the low-power electronics the ability to dissipate heat using the heatsink. Further, if the common heatsink should become warmer than the low-power electronics, the heatsink will begin to thermally pollute the low-power electronics by translating heat to the low-power electronics from the heatsink. In other words, this situation could produce the undesired effect of having heat sensitive electronics absorbing heat from the common heatsink while at the same time being unable to dissipate the heat it generates itself. With embodiments of the present invention, conductive heat paths within an enclosure are decoupled so that thermal energy generated by the low-power electronics is conductively channeled to a heatsink designated for the low-power electronics while thermal energy generated by the high-power electronics is conductively channeled to a heatsink designated for the high-power electronics.

Figure 1D:
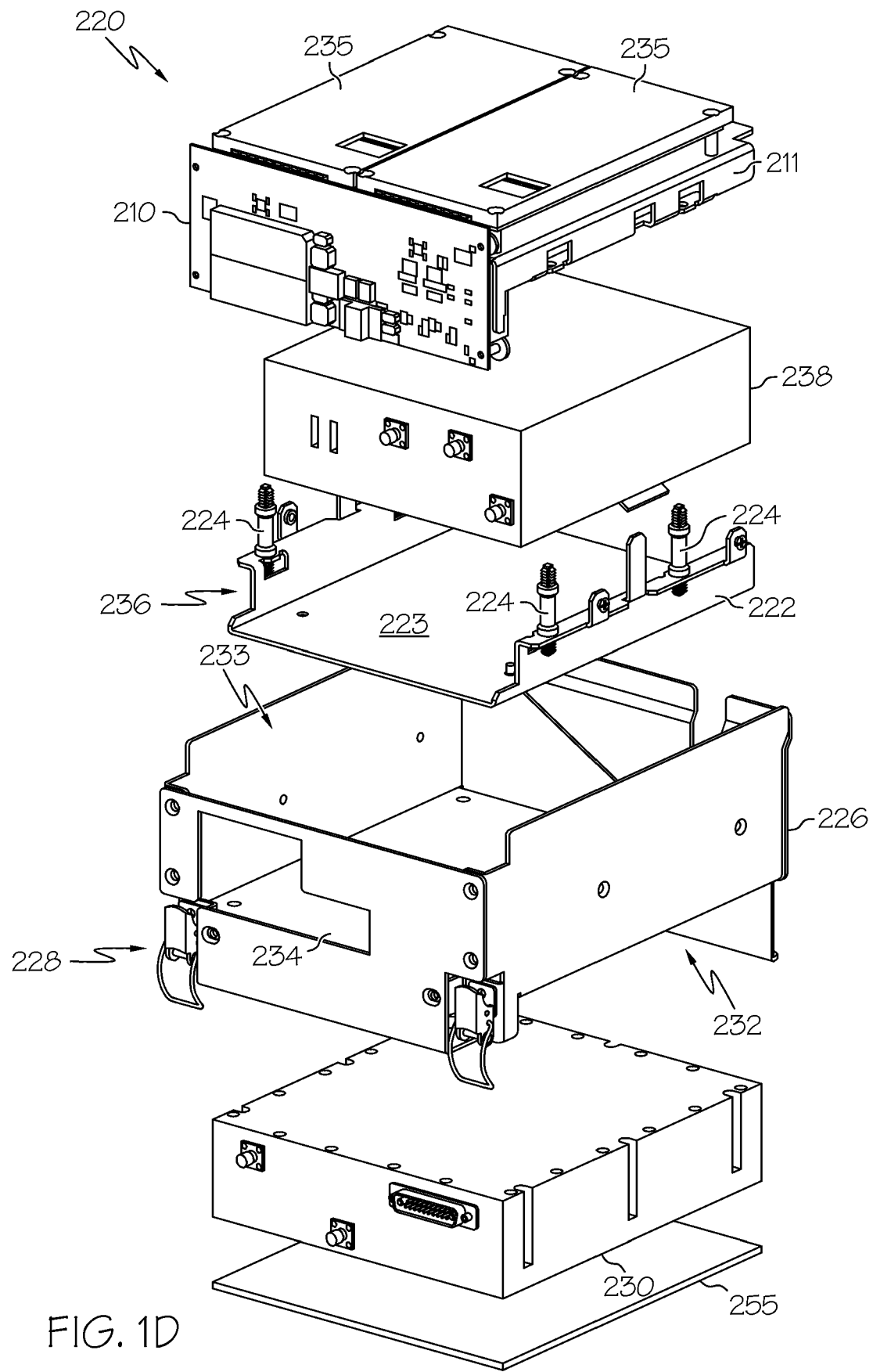
FIGS. 1D-1F illustrate an electrical components module of one embodiment of the present invention.
Figure 1E:
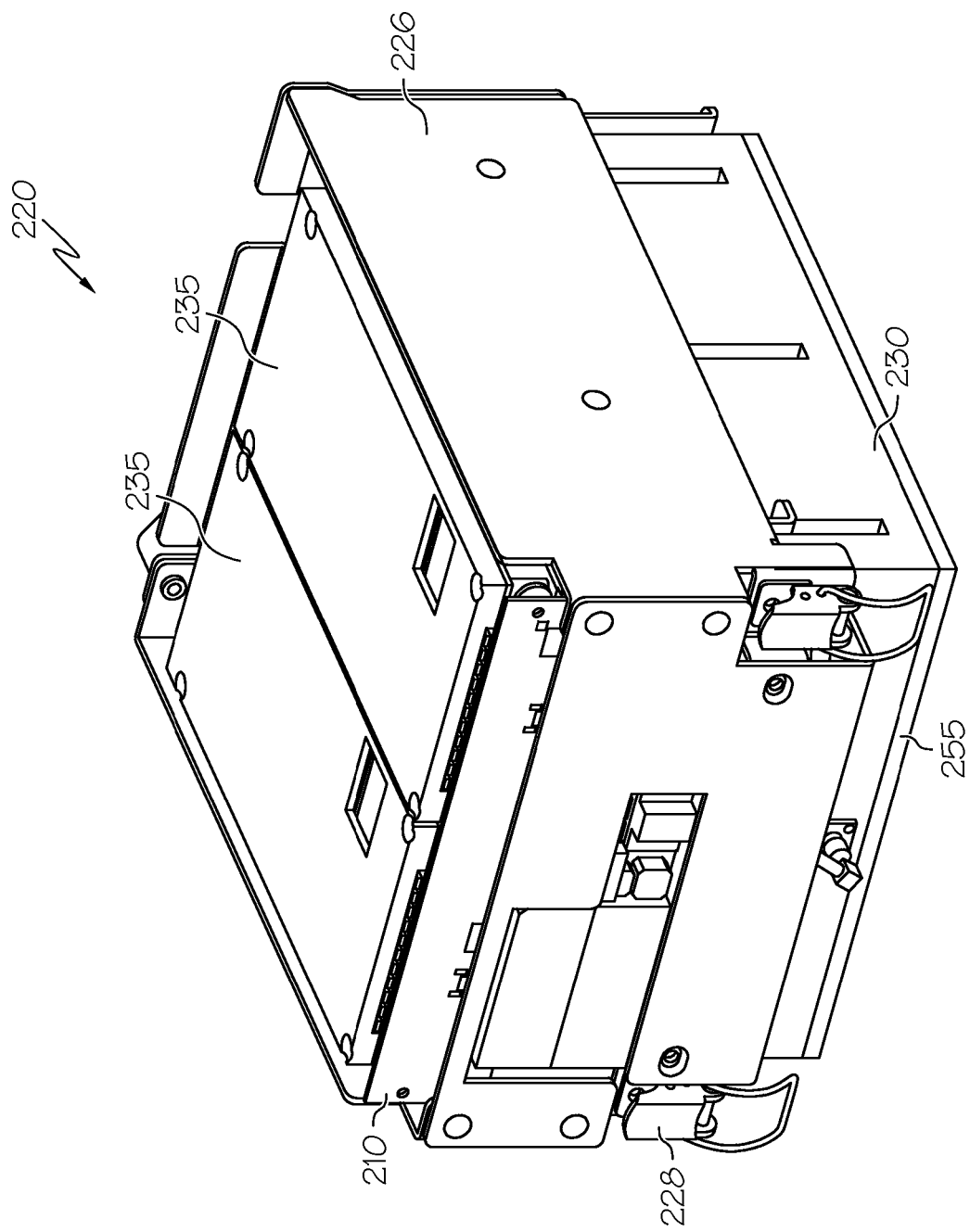
Figure 1F:
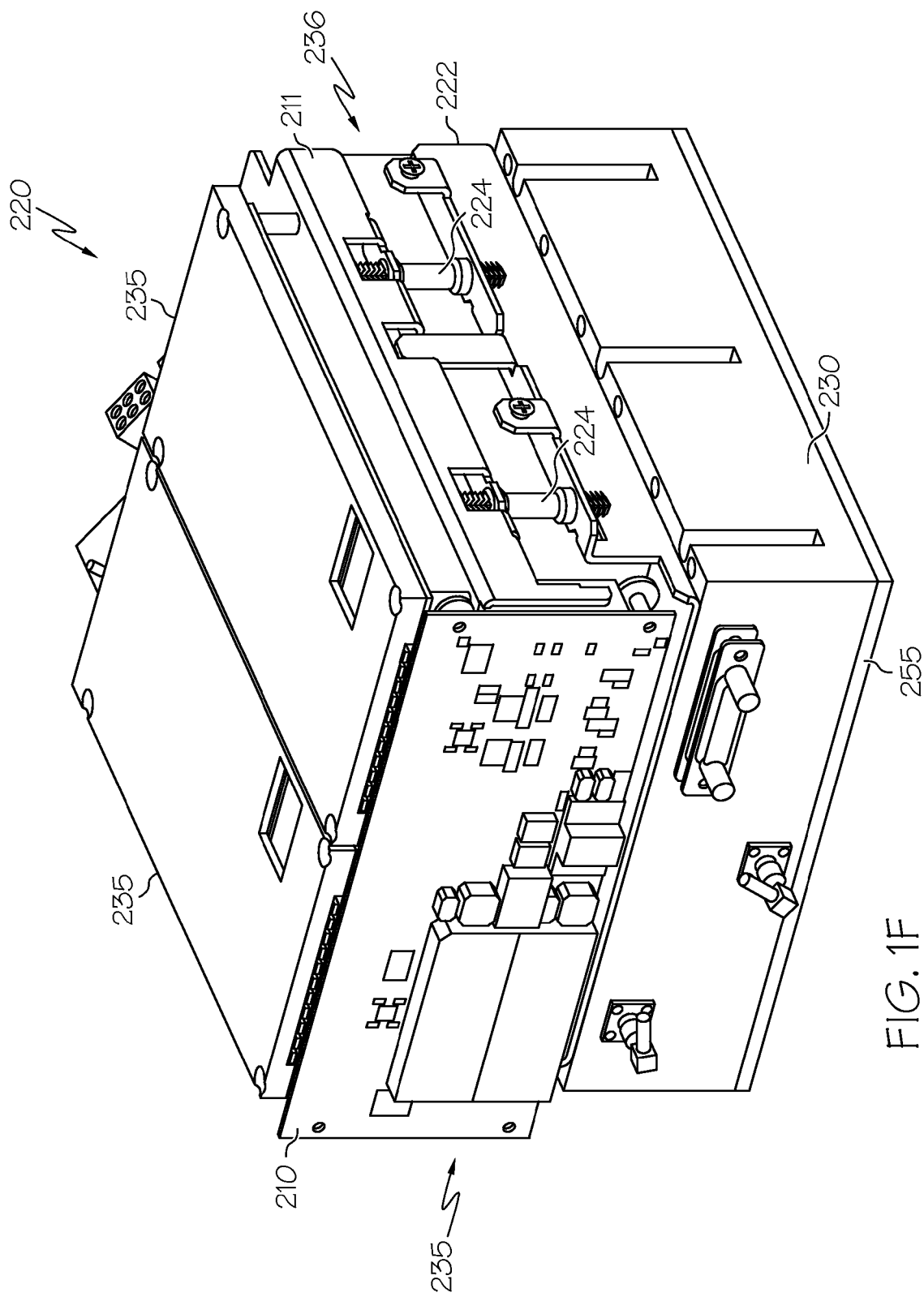

FIGS. 1D-1F illustrate an electrical components module 220 of one embodiment of the present invention. FIG. 1D provides an exploded view of the assembled electrical components module 220 illustrated in FIG. 1E. Electrical components module 220 comprises one or more low-power thermally sensitive electronic components 235 and 210. Electrical components module 220 further comprises one or more high-power thermally tolerant electronic components, illustrated at 230 in FIGS. 1A-1F.

The high-power thermally tolerant electronic components 230 are secured to and mounted within a first compartment as shown generally at 232 of module enclosure 226 in FIG. 1D. The low-power thermally sensitive electronic component 235 is mounted within and secured to a second compartment as shown generally at 233 of the module enclosure 226 in FIG. 1D.

When electrical components modules 220 are mounted within enclosure 100 (FIGS. 1A and 1B), the high-power electronic components 230 come into contact with structural backplane 105 and are thus conductively, thermally coupled together. In another implementation of this embodiment, thermal conductivity from the high-power thermally tolerant electronic components 230 to the base 141 of the backplane heatsink 105 is enhanced by the use of a thermal-conduction-enhancement layer 255. The optional thermal-conduction-enhancement layer 255 is positioned between the high-power thermally tolerant electronic components 230 and the backplane heatsink 105 (FIG. 1B). The thermal-conduction-enhancement layer 255 includes advanced materials, which serve to evenly distribute the absorbed heat load through the backplane heatsink 105. In one implementation of this embodiment, the exemplary thermal-conduction-enhancement layer 255 is a vapor chamber. In another implementation of this embodiment, the exemplary thermal-conduction-enhancement layer 255 is a layer of phase change material 255.

Specifically, the high-power thermally tolerant electronic components 230 contact the phase change material 255 (FIG. 1E) and the phase change material 255 contacts the high-power heatsink 105 (also referred to herein as "second heatsink 105") so that the phase change material conductively, thermally couples the interfacing surfaces of electrical components module 220 and second heatsink 105.

As one of ordinary skill in the art upon reading this specification would recognize, upon reaching a temperature threshold, a phase change material begins to melt from a solid to a liquid. Initially, the temperature of the solid-liquid phase change material rises as the material absorbs heat. When the phase change material reaches the temperature at which the change phase begins (i.e., the melting temperature) the phase change material absorbs large amounts of heat at an almost constant temperature. The phase change material continues to absorb heat without a significant raise in temperature until all the material is transformed to the liquid phase. When the ambient temperature around a liquid material falls, the phase change material solidifies, releasing its stored latent heat. Thus, the phase change material maintains its temperature while it continues to absorb heat, as long as it continues to melt. Once melted, the phase change material will provide a structurally compliant, highly conductive heat path to the heatsink backplane 105. Typically, the phase change material is encased in a casing to hold the phase change material in the desired shape.

In one implementation of this embodiment, airflow through the backplane heatsink 105 is enhanced through one or more forced air techniques such as the Venturi assisted systems and methods described in the '309 Application, which is herein incorporated by reference. In another implementation of this embodiment, internal fins 143 of the heatsink 105 are formed from vapor chambers. This embodiment maximizes the equivalent thermal conductivity of the internal fins 143, spreading the heat more evenly between the base 141 and the integral shield 142 of the backplane heatsink 105. In yet another implementation of this embodiment, the vapor chambers are installed and encapsulated into the base 141 of the high-power heatsink 105. In this embodiment, the vapor chambers are rectangular, copper stampings that interface directly with the high-power electronics in order to spread any focused load out, evenly, to all vertical fins of the heatsink.

In yet another implementation of this embodiment, the backplane heatsink 105 includes a plurality of fins running the length of the structural backplane 105, either instead of, or in addition to, vapor chambers 255 for the purpose of further promoting heat exchange between structural backplane 105 and the air of the environment surrounding enclosure 100. In that case the open spaces between the fins at either end of structural backplane 105 form cavities (open spaces) similar in function to the convective openings 140. In implementations of this embodiment, the backplane heatsink 105 the fins are formed from vapor chambers.

Referring now to FIG. 1D, the one or more low-power thermally sensitive electronic components 235 and 210 are supported on the bracket 211. The bracket 211 is secured to suspension frame 222. Suspension frame 222 in turn mounts within and is secured to a second compartment as shown generally at 233 of the module enclosure 226. In this manner, the thermally isolating suspension supports 224 provide compressibility to the low-power thermally sensitive electronic components 235 and the bracket 211 when the one or more electrical components modules 220 are mounted in the enclosure 100 and the doors 110 are closed. This compressibility of the thermally isolating suspension supports 224 provides a normal force between the one or more low-power thermally sensitive electronic components 235 and the closed doors 110 so that there is continuous physical contact between the one or more low-power thermally sensitive electronic components 235 and the closed doors 110. This continuous physical contact ensures the continuous provision of a thermally conductive path between the low-power thermally sensitive electronic components 235 and the closed doors 110.

In embodiments, the thermally isolating suspension supports 224 comprise one or more of springs, rubber material, polymers, composite materials, or other materials known to those of skill in the art to possess structural strength, compressibility, and high thermal isolation qualities. FIG. 1F provides a view of the electrical components module 220 illustrated in FIG. 1E in which the module enclosure 226 is not visible, in order to show the positional relationship of the bracket 211, the suspension frame 222, the high-power electronic components 230, and the low-power components 235 and 210.

Thermally isolating suspension supports 224 thermally decouple the one or more low-power thermally sensitive electronic components 235 from the high-power thermally tolerant electronic components 230 by providing both a physical separation of these respective components and by avoiding (or eliminating) formation of thermally conductive paths between the at least one high-power thermally tolerant electronic component 230 and the at least one low-power thermally sensitive electronic component 235. The thermal isolation between the high-power thermally tolerant electronic component 230 and the low-power thermally sensitive electronic component 235 prevents the flow of thermal energy to from the high-power electronic components 230 to the low-power components 235.

If the suspension supports 224 are formed from metallic springs, then the suspension supports 224 conduct thermal energy, but the heat from high-power electronic components 230 has to travel a long path of relatively thin metal to reach the heatsink fins 107. The long path of relatively thin metal is not an effective thermal conduction path in comparison to the thermal conduction path from the high-power electronic components 230 to the structural backplane 105. Thus, metallic springs effectively reduce the thermal coupling between the one or more low-power thermally sensitive electronic components 235 and the high-power thermally tolerant electronic components 230. Greater thermal isolation is provided by springs formed from thermally isolating material or from springs that are attached to the suspension frame 222 with a thermally isolating material.

The enclosure 226 has a partition-surface 234 (FIG. 1D) between the first compartment 232 and the second compartment 233. In one implementation of this embodiment, the suspension frame 222 is positioned within the second compartment 233 so that an air space is provided between the surface 223 of the suspension frame 222 and the partition-surface 234 of the module enclosure 226. In another implementation of this embodiment, the surface 223 supports one or more low-heat generating component such as, but not limited to, an RF cavity filter 238 that is mounted in the suspension frame 222 between the surface 223 and the bracket 211. In yet another implementation of this embodiment, an air space represented generally at 236 is created between the bracket 211 holding the low-power thermally sensitive electronic components 235 and the surface 223 of suspension frame 222. In yet another implementation of this embodiment, the low-heat generating component 238 is offset from the partition-surface 234 by use of a standoff of a relatively thermally insulating material or by a geometry (positioning) creating an air space.

The low-power thermally sensitive electronic components 235 become conductively thermally coupled to doors 110, also referred to herein as "first heatsink 111" (FIG. 1B), of enclosure 100 when the doors 110 are closed. Specifically, suspension supports 224 compress and provide normal force to push the low-power thermally sensitive electronic components 235 against the doors 110. The normal forces provided by the suspension supports 224 ensure the thermally conductive path between the interfacing surfaces of electrical components module 220 and the first heatsink 111. Thus, the first heatsink 111 for low-power thermally sensitive electronic components 235 is thermally decoupled from the second heatsink 105 used to dissipate heat generated by the high-power electronic components 230.

The doors 110, which form the first heatsink 111, and structural backplane 105, which forms the second heatsink 105, are physically joined to form the enclosure 100 but are relatively decoupled thermally from each other by a long, relatively thin conduction path of the hinges 115. Even though there is metal-to-metal contact between doors 110 and structural backplane 105 at hinges 115, heat from structural backplane 105 would have to travel a long path of relatively thin metal to reach the heatsink fins 107 and interfere with the ability of doors 110 to dissipate the heat of the low-power electronics 235. In alternate embodiments, greater thermal isolation between doors 110 and structural backplane 105 can be achieved by introducing thermal isolation material between them.

Figure 2A:
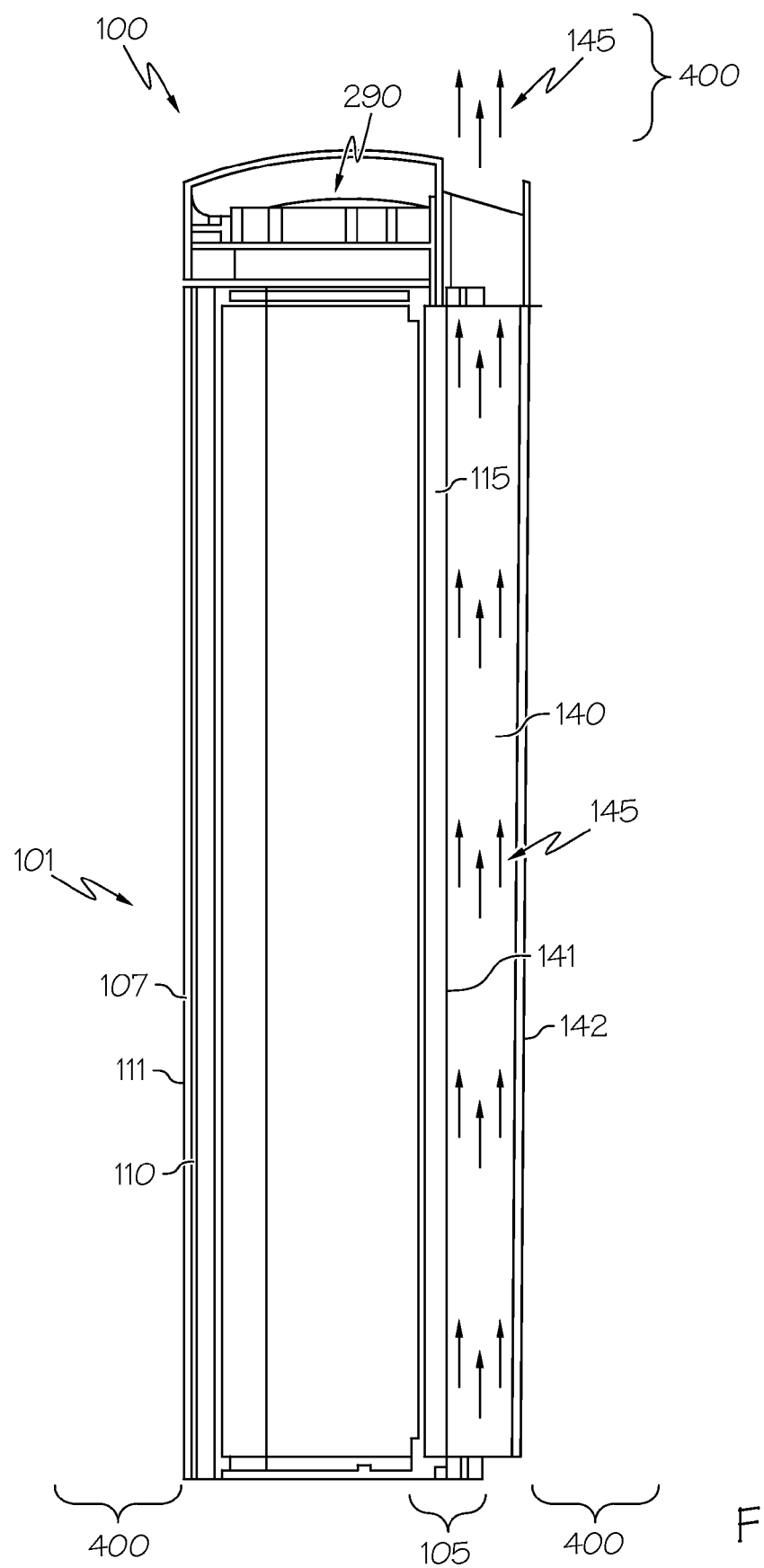
FIG. 2A illustrates natural convection for one embodiment of the present invention.

FIG. 2A illustrates natural convection for one embodiment of the present invention. In FIG. 2A, the heat removal system 101 is shown in operation in which the closed doors 110 form the first heatsink 111 and the back surfaces 141 and 142 of the heat removal system 101 form the second heatsink 105. The heat generated by high-power electronic components 230 (FIGS. 1A-1F) is channeled to the second heatsink 105 specifically designed to dissipate the amount of thermal energy generated by these devices to the external environment 400. In one embodiment, natural convection is established through the plurality of convective openings 140 in second heatsink 105 to transfer heat from high-power electronic component 230 thermally contacting the second heatsink 105 to the air of the external environment 400 surrounding enclosure 100 as shown by the airflow represented generally at 145. In operation, heat generated by low-power electronics 235 is channeled to the first heatsink 111, which is specifically designed (e.g., with the fins 107) to dissipate the amount of thermal energy generated by these low-power electronics 235 to the environment. The first heatsink 111 is thermally decoupled from the second heatsink 105. Embodiments of the present invention thus provide for a sealed electrical enclosure 100 that has thermally independent conduction paths leading to thermally independent heatsinks 111 and 105 for high-power components and heat sensitive low-power components housed within the electrical enclosure 100.

Figure 2B:
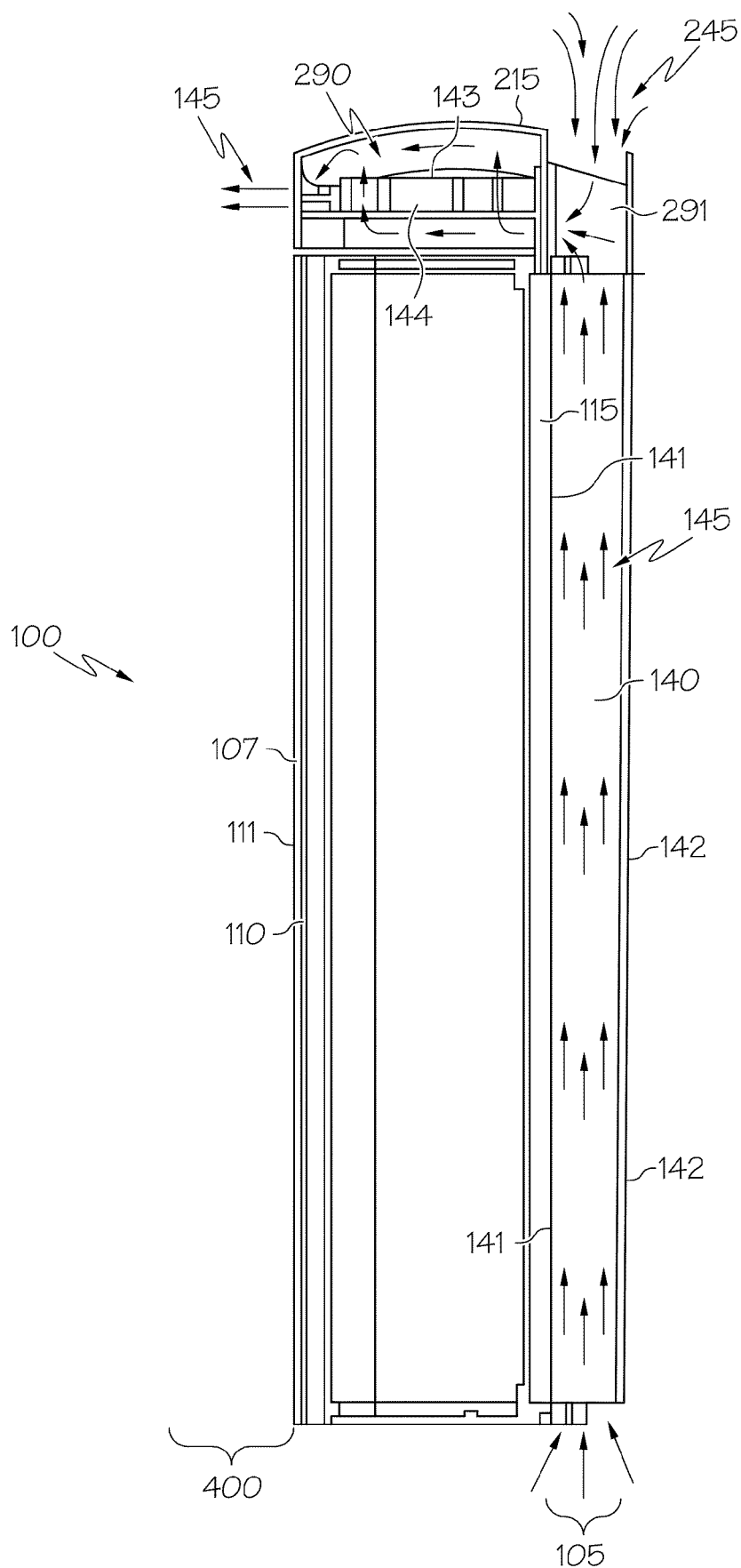
FIG. 2B illustrates forced air convection for one embodiment of the present invention.

FIG. 2B illustrates forced air convection for one embodiment of the present invention. In this embodiment, forced convection cooling through convective openings 140 (using Venturi fan assisted cooling unit 290, for example) is used to increase the airflow 145 to increase the transfer heat from structural backplane 105 to the air of the external environment 400 surrounding enclosure 100 as shown generally in FIG. 2B and described in greater detail in the '309 Application, which is herein incorporated by reference. Venturi fan assisted cooling unit 290 comprises a fan shroud 215 having at least one electrical fan 143. A Venturi chamber 291 is formed from the integral shield 142 that is connected to the fan shroud 215. As shown in FIG. 2B, because of the placement of integral shield 142, air drawn into fan 144 must flow into Venturi chamber 291 either through the convective openings 140 of the structural backplane 105 (shown generally by airflow 145), or drawn in from above Venturi chamber 291 (shown generally by airflow 245). The airflow 145 flowing up from backplane 105 will be heated by the heat dissipated from high-power thermally tolerant electronic components 230 and thus will be significantly more buoyant than the ambient air of airflow 245. As a result, fan 144 will draw in more air from backplane 105 than it is going to draw in from the top of Venturi chamber 291. When the Venturi fan assisted cooling unit 290 is off, the natural convection, as shown in FIG. 2A, is established through the convective openings 140.

Figure 3:
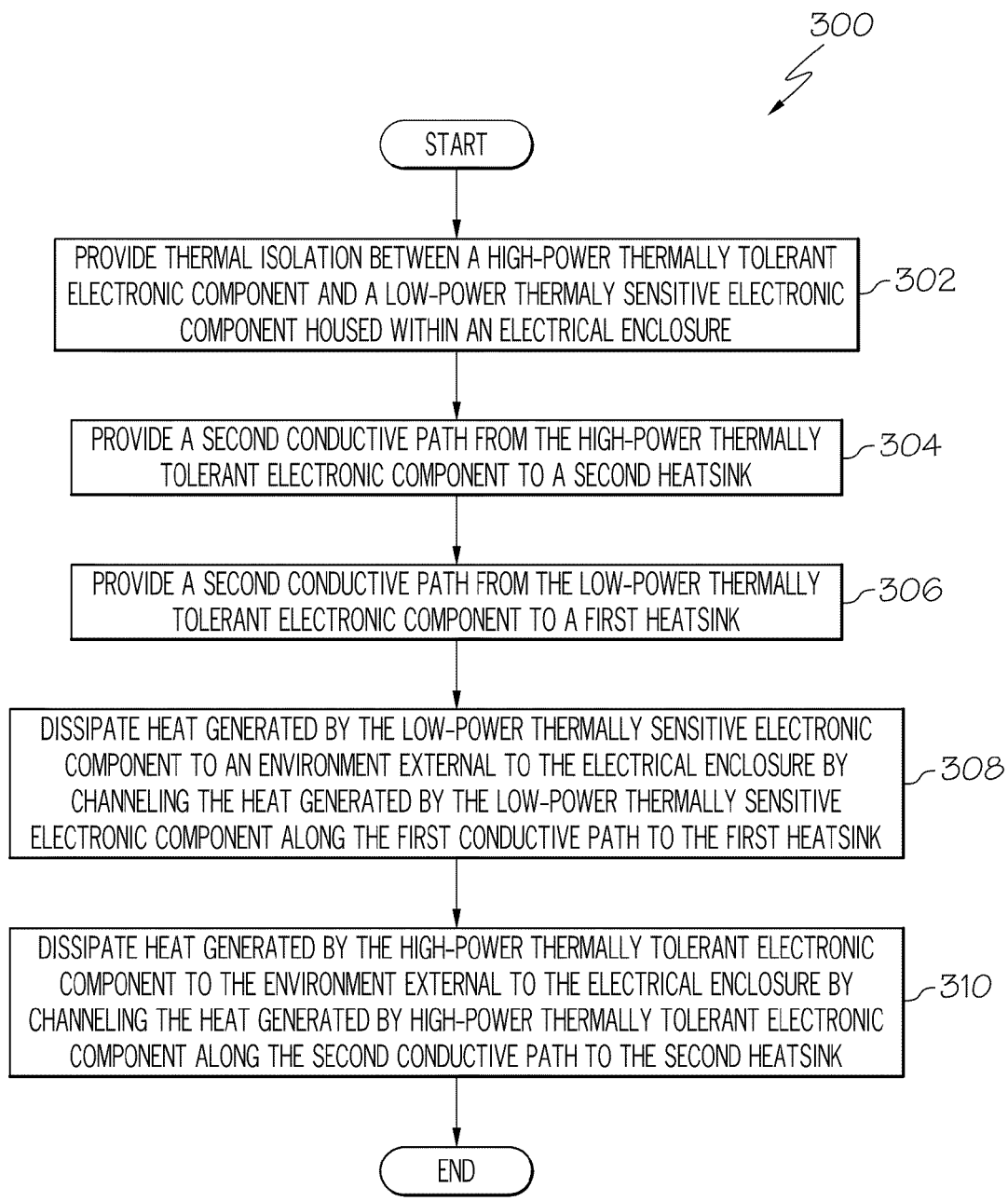
FIG. 3 is a flow chart illustrating a method of one embodiment of the present invention.

FIG. 3 is a flow chart illustrating a method 300 for thermal management of one embodiment of the present invention. The method 300 is described with reference to the heat removal system 101 of FIG. 1B.

At block 302, thermal isolation is provided between a high-power thermally tolerant electronic component 230 and a low-power thermally sensitive electronic component 235 housed within a sealed electrical enclosure 100. The thermal isolation between the high-power thermally tolerant electronic component 320 and the low-power thermally sensitive electronic component 235 is provided by forming an electrical components module 120 including the high-power thermally tolerant electronic component 230 and the spatially separated low-power thermally sensitive electronic component 235. When the electrical components module 120 is formed a physical separation is provided between the high-power thermally tolerant electronic component 230 and the low-power thermally sensitive electronic component 235. Additionally, when the electrical components module 120 is formed, formation of thermally conductive paths between the high-power thermally tolerant electronic component 230 and the low-power thermally sensitive electronic component 235 is avoided.

In order to physically separate the high-power thermally tolerant electronic component 230 and the low-power thermally sensitive electronic component 235, the high-power thermally tolerant electronic component 230 is mounted within and secured to a first compartment 232 of a module enclosure 226 (FIG. 1D) and the low-power thermally sensitive electronic component 235 is mounted within and secured to the second compartment 233 of the module enclosure 226. An air space is formed between the high-power thermally tolerant electronic component 230 and the low-power thermally sensitive electronic component 235 as described above. The air space is less conducive to thermal conduction than the first heatsink 111 and second heatsink 105 that are in thermal contact with the respective high-power thermally tolerant electronic component 230 and the low-power thermally sensitive electronic component 235.

The low-power thermally sensitive electronic component 235 is secured to a second compartment 233 of the module enclosure 226 by attaching the low-power thermally sensitive electronic component 235 to a suspension frame 222 via one or more thermally isolating suspension supports 224. The suspension frame 222 is mounted within the second compartment 232 of the module enclosure 226 as described in the '589 application, which is herein incorporated by reference.

At block 304, a second conductive path is provided from the high-power thermally tolerant electronic component 230 to the second heatsink 105 by thermally contacting the high-power thermally tolerant electronic component 230 to the second heatsink 105. The second conductive path is also referred to herein as a "second thermally conductive path." The interface region between the second heatsink 105 and high-power thermally tolerant electronic component 230 is a portion of the second conductive path. Specifically, the second thermally conductive path includes the high-power thermally tolerant electronic component 230 that generates the heat, the second heatsink 105, and the region there-between.

In one implementation of this embodiment, thermally contacting the high-power thermally tolerant electronic component 230 to the second heatsink 105 involves contacting the high-power thermally tolerant electronic component 230 to a phase change material 255 (FIGS. 1D-1F) and contacting the phase change material 255 to the second heatsink 105. In this embodiment, the second conductive path also includes the phase change material 255. In another implementation of this embodiment, thermally contacting the high-power thermally tolerant electronic component 230 to the second heatsink 105 involves contacting the high-power thermally tolerant electronic component 230 to a vapor chamber 255 and contacting the vapor chamber 255 to the second heatsink 105. In this embodiment, the second conductive path also includes the vapor chamber 255.

At block 306, a first conductive path is provided from the low-power thermally sensitive electronic component 235 to a first heatsink 111. The first conductive path, also referred to herein as a "first thermally conductive path," is provided by contacting the low-power thermally sensitive electronic component 235 to the first heatsink 111. The interface region between the first heatsink 111 (i.e., the doors 110) and the low-power thermally sensitive electronic component 235 is a portion of the first conductive path. Specifically, the first conductive path includes the low-power thermally sensitive electronic component 235, the first heatsink 111, and the region there-between when the doors 110 are closed.

The first thermally conductive path is provided by positioning electrical components modules 120 (including the low-power thermally sensitive electronic component 235) in the electrical enclosure 100 and closing the doors 110 so that the low-power thermally sensitive electronic component 235 is enclosed in the enclosure 100. In this configuration, the doors 110 contact the low-power thermally sensitive electronic component 235. The first conductive path is independent from the second conductive path. The second heatsink 105 is thermally independent from the first heatsink 111 since the hinges 115 that connect the second heatsink 105 to the first heatsink 111 form a long, relatively thin and therefore relatively ineffective thermal conduction path.

At block 308, heat generated by the low-power thermally sensitive electronic component 235 is dissipated to an environment 400 external to the electrical enclosure by channeling the heat generated by the low-power thermally sensitive electronic component 235 along the first conductive path to the first heatsink 111. At block 310, heat generated by the high-power thermally tolerant electronic component 345 is dissipated to an environment 400 external to the electrical enclosure 100 by channeling the heat generated by high-power thermally tolerant electronic component 230 along the second conductive path to the second heatsink 105.

Although specific embodiments have been illustrated and described herein, it will be appreciated by those of ordinary skill in the art that any arrangement, which is calculated to achieve the same purpose, may be substituted for the specific embodiment shown. Features shown specific to one embodiment may be combined with, or replace, features shown in other embodiments. This application is intended to cover any adaptations or variations of the present invention. As one example, electrical enclosures having only a single door, or multiple doors having shapes different from those described above are contemplated as within the scope of the present invention. Therefore, it is manifestly intended that this invention be limited only by the claims and the equivalents thereof.

What is claimed is:

1. A method for thermal management, the method comprising:
   providing thermal isolation between at least one high-power thermally tolerant electronic component and at least one low-power thermally sensitive electronic component housed within an electrical enclosure;
   providing a first conductive path from the at least one low-power thermally sensitive electronic component to a first heatsink comprising at least one door including a series of fins;
   providing a second conductive path from the at least one high-power thermally tolerant electronic component to a second heatsink comprising a structural backplane including a plurality of convective openings, wherein the first conductive path is substantially independent from the second conductive path, and wherein the first heatsink is thermally substantially independent from the second heatsink;
   dissipating heat generated by the at least one low-power thermally sensitive electronic component to an environment external to the electrical enclosure by channeling the heat generated by the at least one low-power thermally sensitive electronic along the first conductive path to the first heatsink; and
   dissipating heat generated by the at least one high-power thermally tolerant electronic component to the environment external to the electrical enclosure by channeling the heat generated by the at least one high-power thermally tolerant electronic component along the second conductive path to the second heatsink.

2. The method of claim 1, wherein providing thermal isolation between the at least one high-power thermally tolerant electronic component and the at least one low-power thermally sensitive electronic component housed within an electrical enclosure comprises:
   forming an electrical components module including the at least one high-power thermally tolerant electronic component and the at least one low-power thermally sensitive electronic component, the forming including:
      providing a physical separation between the at least one high-power thermally tolerant electronic component and the at least one low-power thermally sensitive electronic component, and
      avoiding formation of thermally conductive paths between the at least one high-power thermally tolerant electronic component and the at least one low-power thermally sensitive electronic component.

3. The method of claim 2, wherein providing the physical separation comprises:
   securing the at least one high-power thermally tolerant electronic component to a first compartment of a module enclosure; and
   securing the at least one low-power thermally sensitive electronic component to a second compartment of the module enclosure, wherein there is an air space between the at least one high-power thermally tolerant electronic component and the at least one low-power thermally sensitive electronic component.

4. The method of claim 3, wherein securing the at least one low-power thermally sensitive electronic component to the second compartment of the module enclosure comprises:
   securing the at least one low-power thermally sensitive electronic component to a suspension frame via one or more thermally isolating suspension supports; and
   mounting the suspension frame within the second compartment of the module enclosure.

5. The method of claim 1, wherein providing the second conductive path from the at least one high-power thermally tolerant electronic component to the second heatsink comprises:
   thermally contacting the at least one high-power thermally tolerant electronic component to the second heatsink.

6. The method of claim 5, wherein thermally contacting the at least one high-power thermally tolerant electronic component to the second heatsink comprises:
   contacting the at least one high-power thermally tolerant electronic component to a phase change material; and
   contacting the phase change material to the second heatsink.

7. The method of claim 5, wherein thermally contacting the at least one high-power thermally tolerant electronic component to the second heatsink comprises:
   contacting the at least one high-power thermally tolerant electronic component to a vapor chamber; and
   contacting the vapor chamber to the second heatsink.

8. The method of claim 1, wherein providing the first conductive path from the at least one low-power thermally sensitive electronic component to the first heatsink comprises:
   positioning the at least one low-power thermally sensitive electronic component in the electrical enclosure, the electrical enclosure having the at least one door; and
   closing the at least one door to enclose the at least one low-power thermally sensitive electronic component in the enclosure, wherein the at least one door contacts the at least one low-power thermally sensitive electronic component.

9. A sealable enclosure for housing at least one electrical components module including one or more high-power electronic components and one or more low-power thermally sensitive electronic components, the enclosure comprising:
   a first heatsink for dissipating heat from the one or more low-power thermally sensitive electronic components to an external environment, the first heatsink comprising at least one door including a series of fins; and a second heatsink for dissipating heat from the one or more high-power electronic components to the external environment, the second heatsink comprising a structural backplane including a plurality of convective openings, wherein the first heatsink and the second heatsink are substantially thermally decoupled from each other, and wherein the one or more high-power electronic components are substantially thermally decoupled from the one or more low-power thermally sensitive electronic components.

10. The sealable enclosure of claim 9, wherein each of the at least one electrical components module comprises:
a suspension frame comprising thermally isolating suspension supports, wherein the one or more low-power thermally sensitive electronic components are secured to suspension frame; and
a module enclosure having a first compartment and a second compartment, wherein the suspension frame mounts within the second compartment and the one or more high-power thermally tolerant electronic components are mounted within the first compartment of the module enclosure.

11. The sealable enclosure of claim 10, wherein each of the at least one electrical components module further comprises:
at least one latching device for securing the electrical components module to the second heatsink.

12. The sealable enclosure of claim 9, further comprising:
phase change material operably positioned to contact the one or more high-power thermally tolerant electronic components in each of the at least one electrical components module to the second heatsink.

13. The sealable enclosure of claim 9, wherein the at least one door of the first heatsink comprises two doors that each pivot around respective hinges, wherein when the doors are closed each of the at least one electrical components module is operably positioned so that the one or more low-power thermally sensitive electronic components contact the two doors of the first heatsink.

14. The sealable enclosure of claim 13, wherein the plurality of convective openings of the structural backplane extend a length of the structural backplane.

15. The sealable enclosure of claim 14, wherein the structural backplane includes vapor chambers.

16. The sealable enclosure of claim 14, wherein the structural backplane includes a Venturi assisted system.

17. The sealable enclosure of claim 13, wherein the structural backplane includes vapor chambers.

18. A heat removal system for a sealed electrical enclosure, the heat removal system comprising:
a first conductive path from at least one low-power thermally sensitive electronic component to a first heatsink, the first heatsink comprising at least one door including a series of fins, the first conductive path operable to dissipate heat generated by the at least one low-power thermally sensitive electronic component to an environment external to the sealed electrical enclosure; and
a second conductive path from at least one high-power thermally tolerant electronic component to a second heatsink, the second heatsink comprising a structural backplane including a plurality of convective openings, the second conductive path operable to dissipate heat generated by the at least one high-power thermally tolerant electronic component to the environment external to the sealed electrical enclosure, wherein the first conductive path is substantially independent from the second conductive path and wherein the first heatsink is thermally substantially independent from the second heatsink.

19. The heat removal system of claim 18, wherein the second conductive path further comprises a thermal-conduction-enhancement layer thermally contacting the high-power thermally tolerant electronic component to a base of the structural backplane.

20. The heat removal system of claim 18, wherein the second heatsink comprises:
a base of the structural backplane in thermal contact with the high-power thermally tolerant electronic component;
at least two internal fins orthogonally arranged on the base; and
an integral shield, wherein the at least two internal fins are enclosed by the base and the integral shield to form the plurality of convective openings.

21. The heat removal system of claim 20, wherein the at least two internal fins further comprise at least one vapor chamber.

22. The heat removal system of claim 18, wherein the at least one door of the first heatsink comprises two doors of the electrical enclosure, the doors being in contact the low-power thermally sensitive electronic component when the doors are closed.

* * * * *